US007779328B2

United States Patent
Kim et al.

(10) Patent No.: US 7,779,328 B2
(45) Date of Patent: Aug. 17, 2010

(54) METHOD AND APPARATUS FOR EFFICIENTLY DECODING CONCATENATED BURST IN A WIBRO SYSTEM

(75) Inventors: Han-Ju Kim, Seoul (KR); Young-Mo Gu, Suwon-si (KR); Eun-Ok Lee, Suwon-si (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 1052 days.

(21) Appl. No.: 11/495,631

(22) Filed: Jul. 31, 2006

(65) Prior Publication Data
US 2007/0038922 A1  Feb. 15, 2007

(30) Foreign Application Priority Data
Jul. 29, 2005  (KR) .................. 10-2005-0069899

(51) Int. Cl.
*H03M 13/00* (2006.01)
(52) U.S. Cl. ...................... 714/755; 375/295
(58) Field of Classification Search .......... 714/755; 375/295, 259, 265
See application file for complete search history.

(56) References Cited

U.S. PATENT DOCUMENTS

2002/0021763 A1* 2/2002 Le Dantec ............. 375/295

OTHER PUBLICATIONS

Berrou et al. Multiple Parallel Concatenation of Circular Recursive Systematic Convolutional (CRSC) codes. 1999, Annal Telecommunication, pp. 166-172.*

* cited by examiner

*Primary Examiner*—Sam Rizk
(74) *Attorney, Agent, or Firm*—Roylance, Abrams, Berdo & Goodman, L.L.P.

(57) ABSTRACT

A method and apparatus for decoding a concatenated burst in a WiBro system are provided. A concatenated decoder fragments a received burst into fragment blocks, decodes at least one of the fragment blocks, and determines whether the decoded fragment block satisfies a circular state. A concatenated decoding controller determines burst quality information of the received burst according to a circular state check result on the decoded fragment block, and determines whether to stop decoding on the received burst according to the burst quality information.

32 Claims, 12 Drawing Sheets

| $(N_{mod}7)$ | S | | | | | | | |
|---|---|---|---|---|---|---|---|---|
| | 0 | 1 | 2 | 3 | 4 | 5 | 6 | 7 |
| 1 | 0 | 6 | 4 | 2 | 7 | 1 | 3 | 5 |
| 2 | 0 | 3 | 7 | 4 | 5 | 6 | 2 | 1 |
| 3 | 0 | 5 | 3 | 6 | 2 | 7 | 1 | 4 |
| 4 | 0 | 4 | 1 | 5 | 6 | 2 | 7 | 3 |
| 5 | 0 | 2 | 5 | 7 | 1 | 3 | 4 | 6 |
| 6 | 0 | 7 | 6 | 1 | 3 | 4 | 5 | 2 |

FIG.9

METHOD AND APPARATUS FOR EFFICIENTLY DECODING CONCATENATED BURST IN A WIBRO SYSTEM

CROSS-REFERENCE TO RELATED PATENT APPLICATIONS

This application claims the benefit under 35 U.S.C. §119 (a) of a Korean Patent Application filed in the Korean Intellectual Property Office on Jul. 29, 2005 and assigned Serial No. 2005-69899, the entire disclosure of which is hereby incorporated by reference.

BACKGROUND OF THE INVENTION

1. Field of the Invention

The present invention relates generally to a wireless digital communication system for high-speed packet data transmission. More particularly, the present invention relates to a method and apparatus for decoding a concatenated burst in a WiBro system.

2. Description of the Related Art

In the existing Wireless Local Area Network (WLAN), an access terminal (AT), due to its short reach, decreases in performance while on the move or if it goes away from an access point (AP). The wireless Internet based on the third generation mobile communication system, though it does not have the problems of the WLAN, has an increase cost. Wireless Broadband Internet (WiBro), also known as Portable Internet, is the service for allowing a user to enjoy high-speed Internet anyplace and anytime, similar to a mobile phone. WiBro is also an intermediate between the wireless Internet and the WLAN. WiBro uses a frequency band of 2.3 GHz, and has an Internet speed (that is, service bandwidth) of about 1 Mbps.

FIG. 1 illustrates a network configuration of the typical WiBro system.

Referring to FIG. 1, the WiBro system includes a Portable Subscriber Station (PSS) 102 serving as an AT, a Radio Access Station (RAS) 104 serving as an AP, an Access Control Router (ACR) 106 serving as a control station, a Home Agent (HA) 108, and an Authentication, Authorization and Accounting (AAA) server 110. The PSS 102 is an apparatus used by a subscriber to receive portable Internet service. The RAS 104 exchanges data with the PSS 102 via a wireless interface at an end of a wire network, and the ACR 106 controls the PSS 102 and the RAS 104, and routes IP packets. The HA 108 supports IP mobility in the home network, and the AAA server 110 permits access to the portable Internet only for an authorized user, and performs authentication, authorization and accounting on users and devices to provide the portable Internet service. A carrier EP network 112 connects the ACR 106 to the HA 108, the AAA server 110 and a common IP network 114.

The WiBro system uses Time Division Multiplexing (TDM) that divides a downlink and an uplink by time. In the WiBro System, Orthogonal Frequency Division Multiplexing Access (OFDMA) is used as a multiple access scheme. An OFDMA symbol is composed of a plurality of subcarriers. For example, the OFDMA symbol is composed of data subcarriers used for data transmission, pilot subcarriers used for estimation of channel and synchronization, and null subcarriers in which a guard interval and DC subcarriers are included.

Downlink transmission is composed of one preamble symbol, Fundamental Channel (FCH) data and Downlink mapping (DL-MAP) information, and a data symbol, in sequence. The downlink transmission starts from a control symbol, and a guard time used for distinguishing uplink/downlink transmission times is inserted between the downlink and the uplink at the middle and end of an uplink frame.

In the wireless interface, a transmission unit of control information or user data is a concatenated burst with a predetermined size. The concatenated burst is made by concatenating several Protocol Data Units (PDUs) that can be allocated to different users. A Hybrid Automatic Repeat reQuest (HARQ) burst also corresponds to a concatenated burst, as it undergoes a fragmentation process. A FCH burst can also be regarded as a concatenated burst composed of a single block.

A concatenated coding scheme fragments an input burst into fragment blocks using a predetermined concatenation rule, encoding each of the fragment blocks, and concatenating the coded fragment blocks back into a coded concatenated burst. The concatenation process depends on a coding scheme of the burst, the number of subchannels allocated to the burst, a modulation scheme used for the burst, and whether the burst supports HARQ.

The concatenated burst, as described above, includes several PDUs, and each PDU includes therein a 32-bit Cyclic Redundancy Code (CRC) indicating the quality of the corresponding PDU itself. However, concatenated coding of the burst is performed in units of fragment blocks defined in the concatenation rule, rather than in units of PDUs. In each concatenated coding process, because only the fragment blocks are simply encoded, burst quality bits for the entire concatenated burst are not inserted. As a result, in the process of decoding the coded concatenated burst, a receiver cannot obtain burst quality information for the entire concatenated burst. Therefore, the receiver should fully decode the entire concatenated burst, fragment the entire decoded concatenated burst into a plurality of PDUs, and then check a CRC of each PDU in order to determine whether the entire concatenated burst was successfully decoded.

For the HARQ burst or a MAP burst, which is fame control information, an input burst is encoded with a CRC inserted at the tail thereof in order to allow the receiver to measure burst quality information for the entire concatenated burst. Therefore, for the MAP burst and the HARQ burst, the receiver can obtain the burst quality information by checking a CRC included in the decoded burst after completing a decoding process for the entire concatenated burst. In conclusion, the conventional decoding technology cannot obtain the burst quality information for the entire concatenated burst before completing the concatenated decoding on all fragment blocks.

Accordingly, there is a need for an improved method and apparatus for obtaining burst quality information for an entire concatenated burst.

SUMMARY OF THE INVENTION

An aspect of exemplary embodiments of the present invention is to address at least the above problems and/or disadvantages and to provide at least the advantages below. Accordingly, an aspect of exemplary embodiments of the present invention is to provide a method and apparatus for obtaining burst quality information of the entire concatenated burst and burst quality information for each individual fragment block in a WiBro system.

An aspect of exemplary embodiments of the present invention provides a method and apparatus for applying a differential decoding algorithm for each individual burst based on burst quality information for the entire concatenated burst and each individual fragment block in a WiBro system.

According to one aspect of exemplary embodiments of the present invention, there is provided a method for decoding a concatenated burst in a WiBro system, in which a received burst is fragmented into fragment blocks; at least one of the fragment blocks is decoded, and whether the decoded fragment block satisfies a circular state is determined; burst quality information of the received burst is determined according to a circular state check result on the decoded fragment block; and whether to stop decoding on the received burst is determined according to the burst quality information.

According to another aspect of exemplary embodiments of the present invention, there is provided an apparatus for decoding a concatenated burst in a WiBro system, in which a concatenated decoder fragments a received burst into fragment blocks, decodes at least one of the fragment blocks, and determines whether the decoded fragment block satisfies a circular state; and a concatenated decoding controller determines burst quality information of the received burst according to a circular state check result on the decoded fragment block, and determines whether to stop decoding on the received burst according to the burst quality information.

According to a further aspect of exemplary embodiments of the present invention, there is provided a method for decoding a frame composed of a plurality of bursts in a WiBro system, in which a fundamental channel (FCH) burst indicating a format of the frame is decoded, arranged at a head of the frame, and whether the decoded burst satisfies a circular state is determined; frame quality information of the FCH burst according to a circular state check result on the decoded burst is determined; and whether to stop decoding on bursts following the frame is determined according to the frame quality information.

According to yet another aspect of exemplary embodiments of the present invention, there is provided an apparatus for decoding a frame composed of a plurality of bursts in a WiBro system, in which a concatenated decoder decodes a fundamental channel (FCH) burst indicating a format of the frame, arranged at a head of the frame, and determines whether the decoded burst satisfies a circular state; and a concatenated decoding controller determines frame quality information of the FCH burst according to a circular state check result on the decoded burst, and determines whether to stop decoding on bursts following the frame according to the frame quality information.

BRIEF DESCRIPTION OF THE DRAWINGS

The above and other objects, features and advantages of certain exemplary embodiments of the present invention will be more apparent from the following detailed description taken in conjunction with the accompanying drawings, in which:

FIG. 9 illustrates exemplary circular memory states for a turbo code with a constraint length K=9 applied to a WiBro system according to an exemplary embodiment of the present invention;

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

An aspect of exemplary embodiments of the present invention is to obtain burst quality information for the entire concatenated burst and each individual burst, for a concatenated burst of a WiBro system. Herein, the concatenated burst means a FCH burst, a HARQ burst, a MAP burst, and a general data burst, each of which is composed of one or more fragment blocks.

Figure 1:
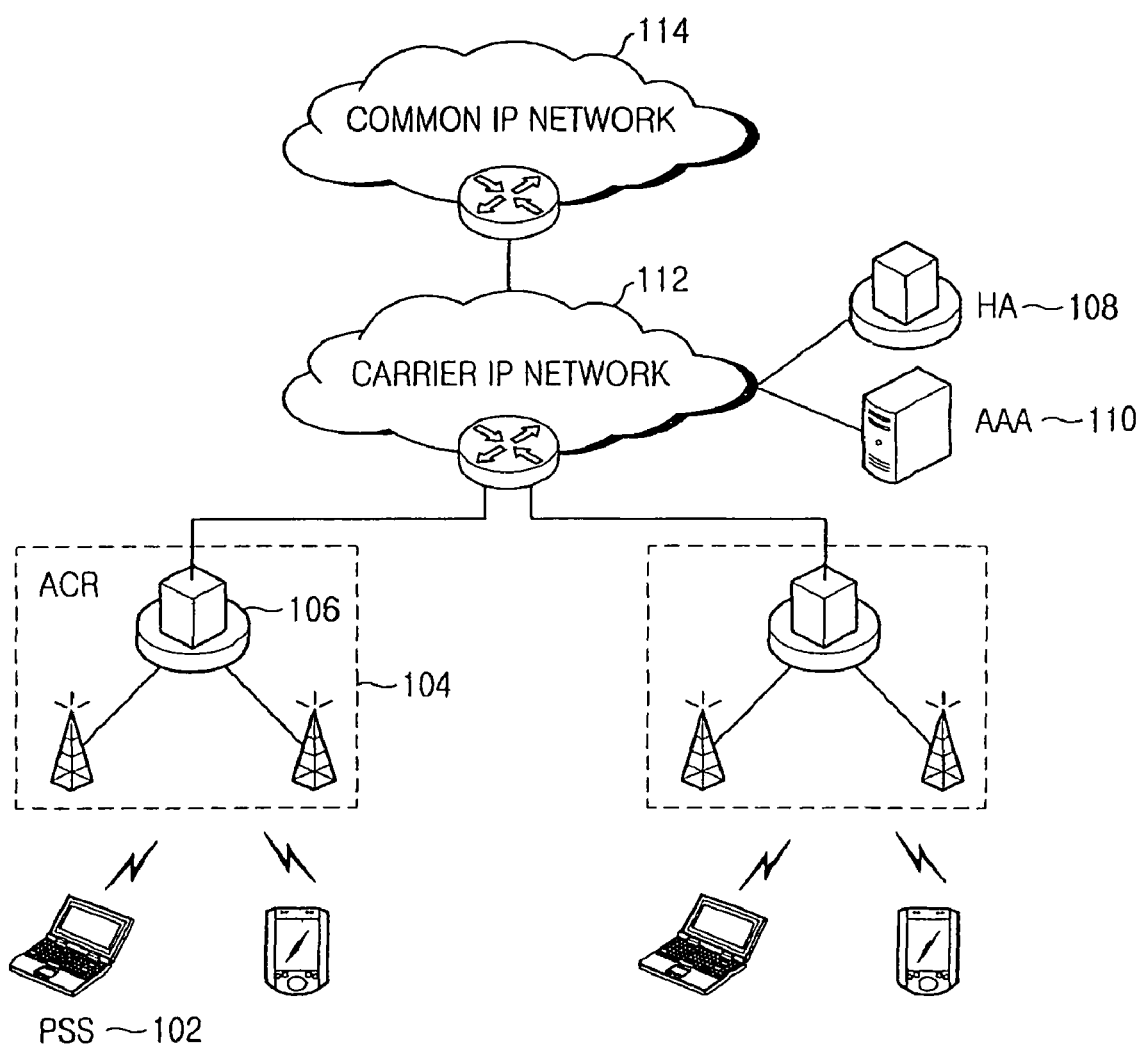
FIG. 1 illustrates a network configuration of the typical WiBro system.
Figure 2:
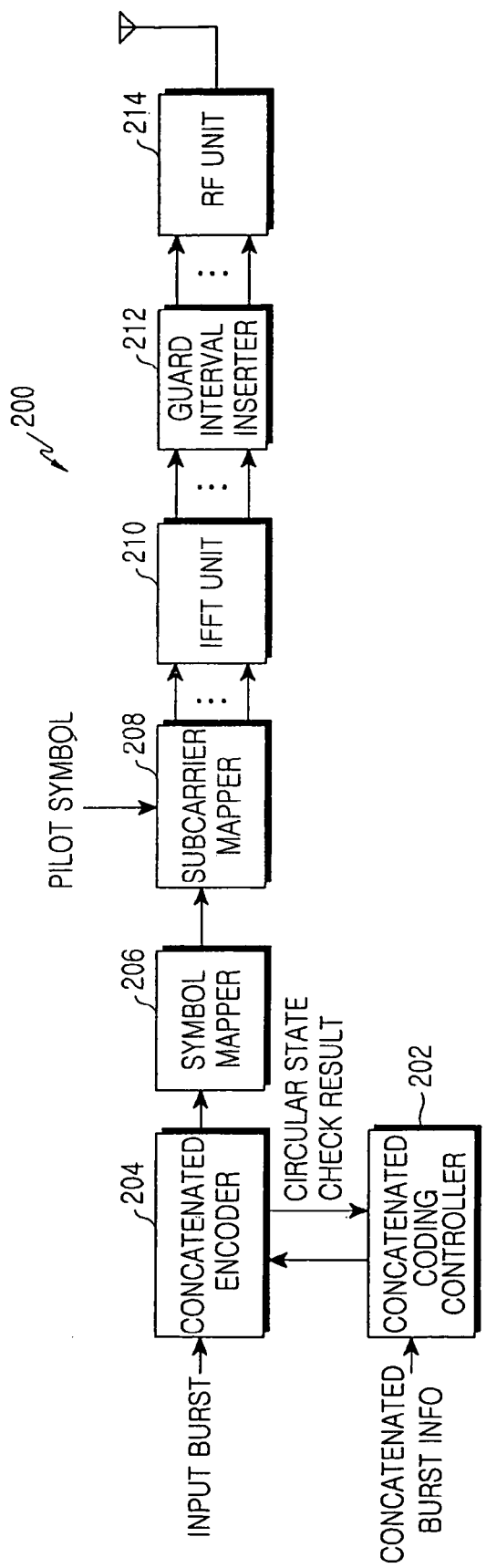
FIG. 2 illustrates a structure of a WiBro transmitter according to an exemplary embodiment of the present invention.

FIG. 2 illustrates a structure of a WiBro transmitter 200 according to an exemplary embodiment of the present invention. As illustrated, the WiBro transmitter 200 includes a concatenated coding controller 202, a concatenated encoder 204, a symbol mapper 206, a subcarrier mapper 208, an Inverse Fast Fourier Transform (IFFT) unit 210, a guard interval inserter 212 and a Radio Frequency (RF) unit 214. It should be noted herein that the key elements associated with WiBro transmission are shown in the drawing.

The concatenated coding controller 202 receives concatenated burst information indicating a concatenation rule, the number of fragment blocks, and a size of each fragment block, and controls the concatenated encoder 204 depending on the concatenated burst information. The concatenated encoder 204, under the control of the concatenated coding controller 202, fragments an input burst into a predetermined number of fragment blocks, encodes each of the fragment blocks according to a corresponding coding scheme, and then concatenates the coded fragment blocks, thereby generating a concatenated burst. The symbol mapper 206 maps the coded bits of the concatenated burst to modulation symbols generated according to a corresponding modulation scheme.

The subcarrier mapper 208 maps the modulation symbols to data subcarriers, and predetermined pilot symbols to pilot subcarriers according to a predetermined mapping pattern, and the IFFT unit 210 converts the subcarrier signals output from the subcarrier mapper 208 into an Orthogonal Frequency Division Multiplexing (OFDM) symbol composed of a predetermined number of samples. The guard interval inserter 212 inserts a prefix or a suffix into the OFDM symbol, as a guard interval for preventing inter-symbol interference, thereby generating an OFDM transmission symbol. Commonly, a Cyclic Prefix (CP) technique for copying last several samples of the OFDM symbol and inserting the copied samples at the head of the OFDM symbol is used for the guard interval. The OFDM transmission symbol is converted into a RF signal by the RF unit 214 and then transmitted via an antenna.

Figure 3:
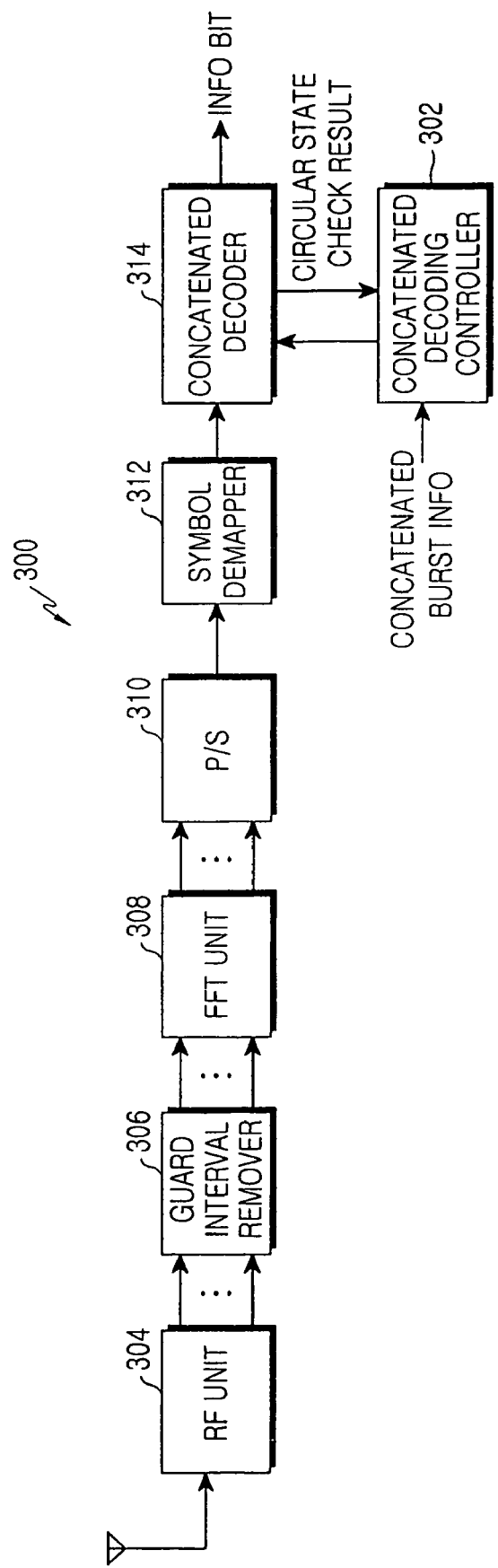
FIG. 3 illustrates a structure of a WiBro receiver according to an exemplary embodiment of the present invention.

FIG. 3 illustrates a structure of a WiBro receiver 300 according to an exemplary embodiment of the present invention. As illustrated, the WiBro receiver 300 includes a RF unit 304, a guard interval remover 306, a Fast Fourier Transform (FFT) unit 308, a Parallel-to-Serial (P/S) converter 310, a symbol demapper 312, a concatenated decoder 314 and a concatenated decoding controller 302. Similarly, the key elements associated with WiBro reception are shown in the drawing.

The RF unit 304 receives an RF signal, and converts the RF signal into a baseband signal including an OFDM transmission symbol. The guard interval remover 306 removes samples corresponding to the guard interval from the OFDM transmission symbol, and outputs an OFDM symbol. The FFT unit 308 converts samples of the OFDM symbol into a frequency domain, and outputs subcarrier signals. The P/S converter 310 converts the parallel input subcarrier signals into a modulation symbol stream, and the symbol demapper 312 demaps the modulation symbol stream output from the P/S converter 310 into original information values.

The concatenated decoding controller 302 receives concatenated burst information indicating a concatenation rule, a number of fragment blocks, and a size of each fragment block, and controls the concatenated decoder 314 depending on the concatenated burst information. The concatenated decoder 314, under the control of the concatenated decoding controller 302, decodes the information values output from the symbol demapper 312 in units of fragment blocks to recover the original information bits, concatenates the recovered information bits in units of fragment blocks, and outputs information bits of the concatenated burst.

Figure 4:
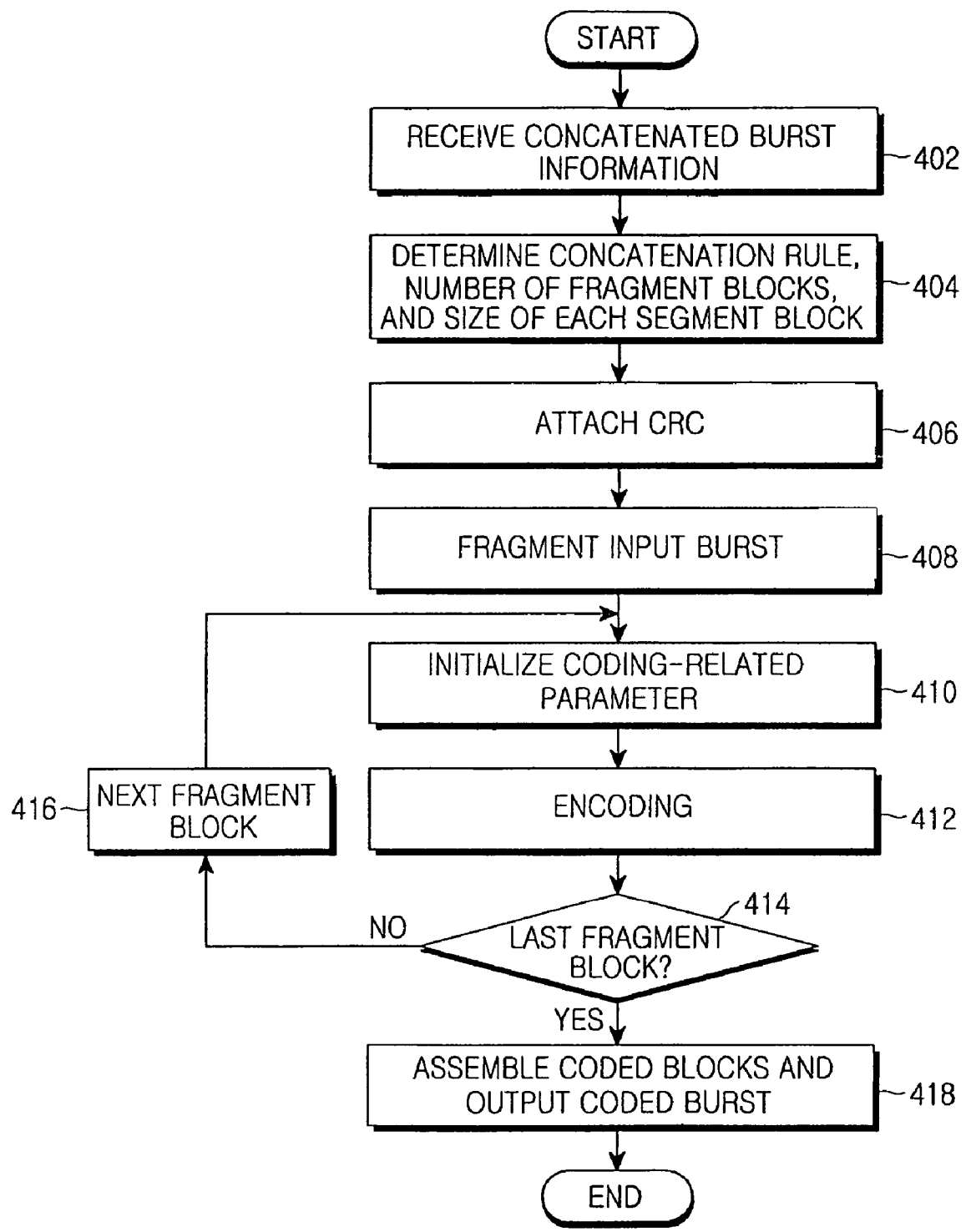
FIG. 4 is a flowchart illustrating a concatenated coding operation of a burst supporting HARQ according to an exemplary embodiment of the present invention.

FIG. 4 is a flowchart illustrating a concatenated coding operation of a burst supporting HARQ according to an exemplary embodiment of the present invention.

Referring to FIG. 4, a concatenated coding controller receives concatenated burst information in step 402, and determines a concatenation rule, the number of fragment blocks, and a size of each fragment block according to the concatenated burst information in step 404. Herein, the concatenated burst information can include modulation information based on a modulation scheme, slot size information, and the like. In step 406, if an input burst supports HARQ, a concatenated encoder attaches a 16-bit CRC to the input burst. In step 408, the concatenated encoder fragments the CRC-attached burst into fragment blocks according to the determined size and number of fragment blocks, and then proceeds to step 410 to encode a first fragment block.

In step 410, the concatenated encoder initializes internal memory states and coding-related parameters according to a coding scheme and a coding rate of a fragment block to be encoded. In step 412, the concatenated encoder encodes the fragment block according to the corresponding coding scheme and coding rate. In step 414, the concatenated encoder determines whether the last fragment block of the input burst has been encoded. If the last fragment block has not been encoded, the concatenated encoder reads the next fragment block in step 416, and then returns to step 410. However, if the last fragment block of the input burst has been encoded, the concatenated encoder assembles the coded blocks in fragmented order, and outputs a coded concatenated burst in step 418.

Figure 5:
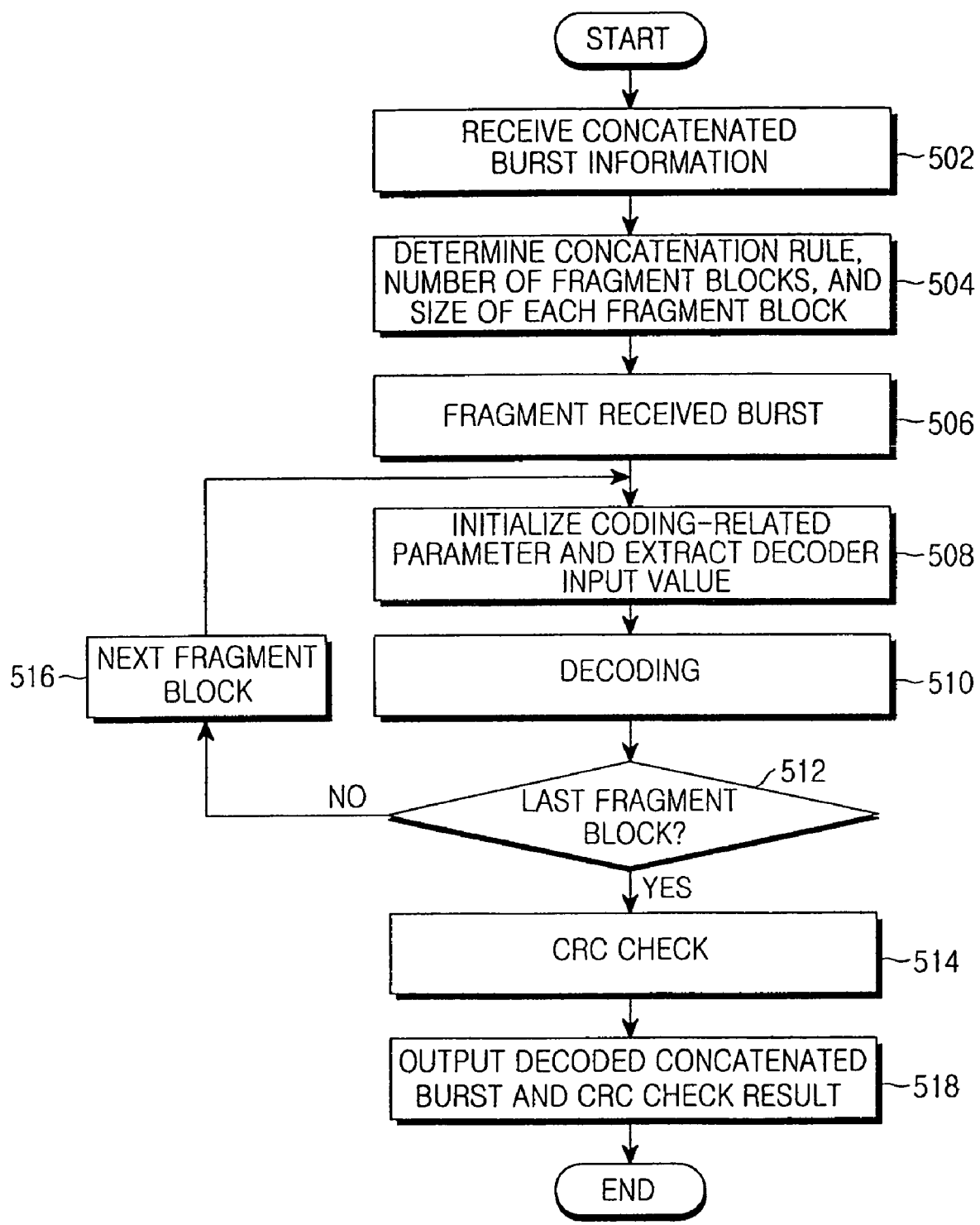
FIG. 5 is a flowchart illustrating a concatenated decoding operation of a burst supporting HARQ according to an exemplary embodiment of the present invention.

FIG. 5 is a flowchart illustrating a concatenated decoding operation of a burst supporting HARQ according to an exemplary embodiment of the present invention.

Referring to FIG. 5, a concatenated decoding controller receives concatenated burst information in step 502, and determines a concatenation rule, the number of fragment blocks, and a size of each fragment block according to the concatenated burst information in step 504. The concatenated burst information can be previously determined, or acquired from control information transmitted from a transmitter to a receiver. In step 506, a concatenated decoder fragments a received burst into fragment blocks according to the determined size and number of fragment blocks, and then proceeds to step 508 to decode a first fragment block.

In step 508, the concatenated decoder initializes memory states and coding-related parameters according to a coding scheme and a coding rate of a fragment block to be decoded, and extracts Log Likelihood Ratio (LLR) values mapped to information bits of the fragment block to be decoded, as decoder input values. In step 510, the concatenated decoder decodes the LLR values of the fragment block according to the coding scheme and coding rate of the corresponding fragment block.

In step 512, the concatenated decoder determines whether the last fragment block of the received burst has been decoded. If the last fragment block has not been decoded, the concatenated decoder reads the next fragment block in step 516, and then returns to step 508. However, if the last fragment block of the received burst has been decoded, the concatenated decoder assembles, in step 514, the decoded blocks in fragmented order to generate a decoded concatenated burst. If the received burst supports HARQ, the concatenated decoder checks a CRC included in the decoded concatenated burst to determine whether there is an error in the concatenated burst. In step 518, the concatenated decoder outputs the decoded concatenated burst together with the CRC check result, completing the concatenated decoding.

The WiBro system uses various coding schemes such as Convolutional Coding, Turbo Coding, Low Density Parity Check (LDPC) coding, and the like. The codewords encoded by the convolutional coding and the turbo coding among the above coding schemes have a circular state characteristic. A description will be made below of an operation in which the conventional and turbo encoders generate codewords such that the encoders have circular states.

Figure 6:
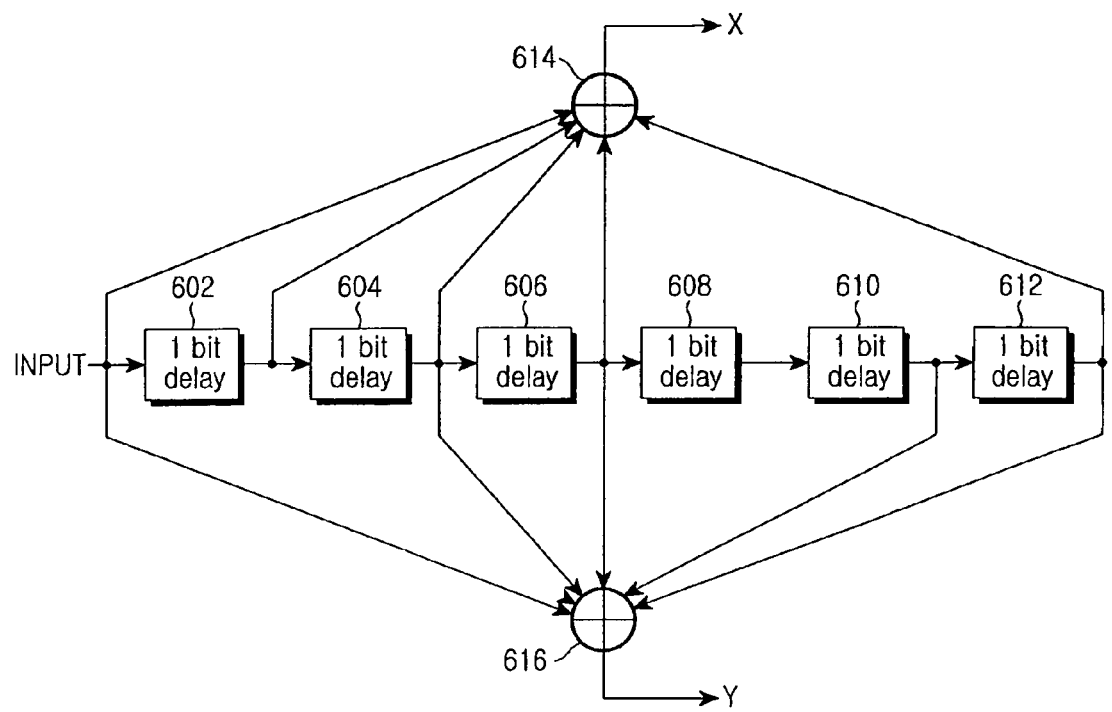
FIG. 6 illustrates a simplified exemplary structure of a convolutional encoder applied to a WiBro system according to an exemplary embodiment of the present invention

FIG. 6 illustrates a simplified exemplary structure of a convolutional encoder applied to a WiBro system according to an exemplary embodiment of the present invention.

As illustrated, input bits are sequentially input to 6 cascaded registers 602, 604, 606, 608, 610 and 612 bit by bit every clock on a shift basis. A first adder 614 generates a coded bit stream X by adding up an input bit, an output bit of a first register 602, the output bit of a second register 604, an output bit of a third register 606, and an output bit of the last register 612. A second adder 616 generates a coded bit stream Y by adding up the input bit, the output bit of the second register 604, the output bit of the third register 606, an output bit of a fifth register 610, and the output bit of the last register 612. Each of the first and second adders 614 and 616 adds up its inputs, performs a modulo-2 operation thereon, and outputs a 1-bit result.

The general convolutional encoder equally matches memory states of the registers 602 to 612 before and after encoding, thereby facilitating decoding of the coded bits. The cascaded registers 602 to 612 are all initialized to '0' before encoding. N input bits $b_0, b_1, b_3, \ldots b_{N-1}$ are sequentially input to registers 602 to 612 on a shift basis, and coded bits are output by the adders 614 and 616. After the last bit $b_{N-1}$ is input, as many tail bits as the number of registers are sequentially input to the registers 602 to 612, so the final memory states become '0', like the initial memory states. That is, the tail bits are determined such that the final memory states are equal to the initial memory states.

Because the tail bits contain no information, tail bit coding reduces the coding rate as much as the number of the tail bits. In order to make up for the defects, the WiBro system uses tail-biting coding that equally matches the final memory states to the initial memory states using input data. This equally matches the final memory states to the initial memory states by initializing the encoder's memory states using input bits. The use of the tail-biting can generate convolutional codes without a loss of the coding rate and a degradation of performance due to the tail bits.

In the convolutional encoder, tail biting can be simply implemented by initializing the memory states with the last (K−1) bits (where K denotes a constraint length of the encoder) of an information block to be encoded.

Figure 7:
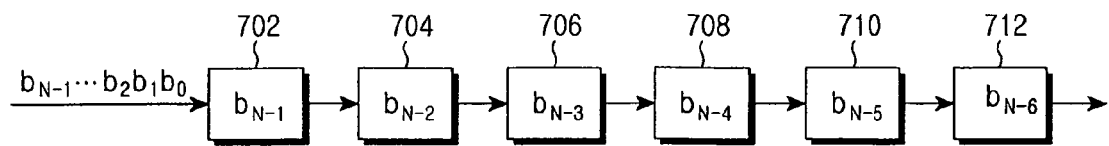
FIG. 7 illustrates an exemplary initialization of a tail-bitted convolutional encoder applied to a WiBro system according to an exemplary embodiment of the present invention.

FIG. 7 illustrates an exemplary initialization of a tail-bitted convolutional encoder applied to a WiBro system according to an exemplary embodiment of the present invention.

As illustrated, if an information block composed of N input bits $b_0, b_1, b_3, b_{N-1}$ is given, 6 cascaded registers 702, 704, 706, 708, 710, 712 are initialized to $b_{N-1}, b_{N-2}, b_{N-3}, b_{N-4}, b_{N-5}, b_{N-6}$, respectively, like the input bits, before encoding.

The N input bits are sequentially input to the registers 702 to 712 on a shift basis, and are encoded by the adders as shown in FIG. 6. In other words, the tail-bitted convolutional coding operation of FIG. 7 initializes initial states (values) of the registers to input bits before encoding, and performs the shift operation and the addition operation by the adders of FIG. 6 according to the sequentially input bits, thereby performing encoding. That is, the memory state of the last bit $b_{N-1}$ by the above encoder is equal to the initial memory state.

The output states (values) by the coding operation are compared with the initial states (values) of the registers. Based on the comparison result, it is possible to determine whether the encoder normally performs encoding. On the contrary, a decoder corresponding to the encoder performs a decoding process, and determines whether it performs a normal decoding operation.

In addition, the WiBro system uses turbo codes based on the convolutional encoder. Duo binary circular recursive systematic convolutional codes are used as the turbo codes. In other words, the turbo code is made by concatenating two convolutional encoders. Each of the convolutional encoders constituting the turbo code is called a constituent encoder.

Figure 8:
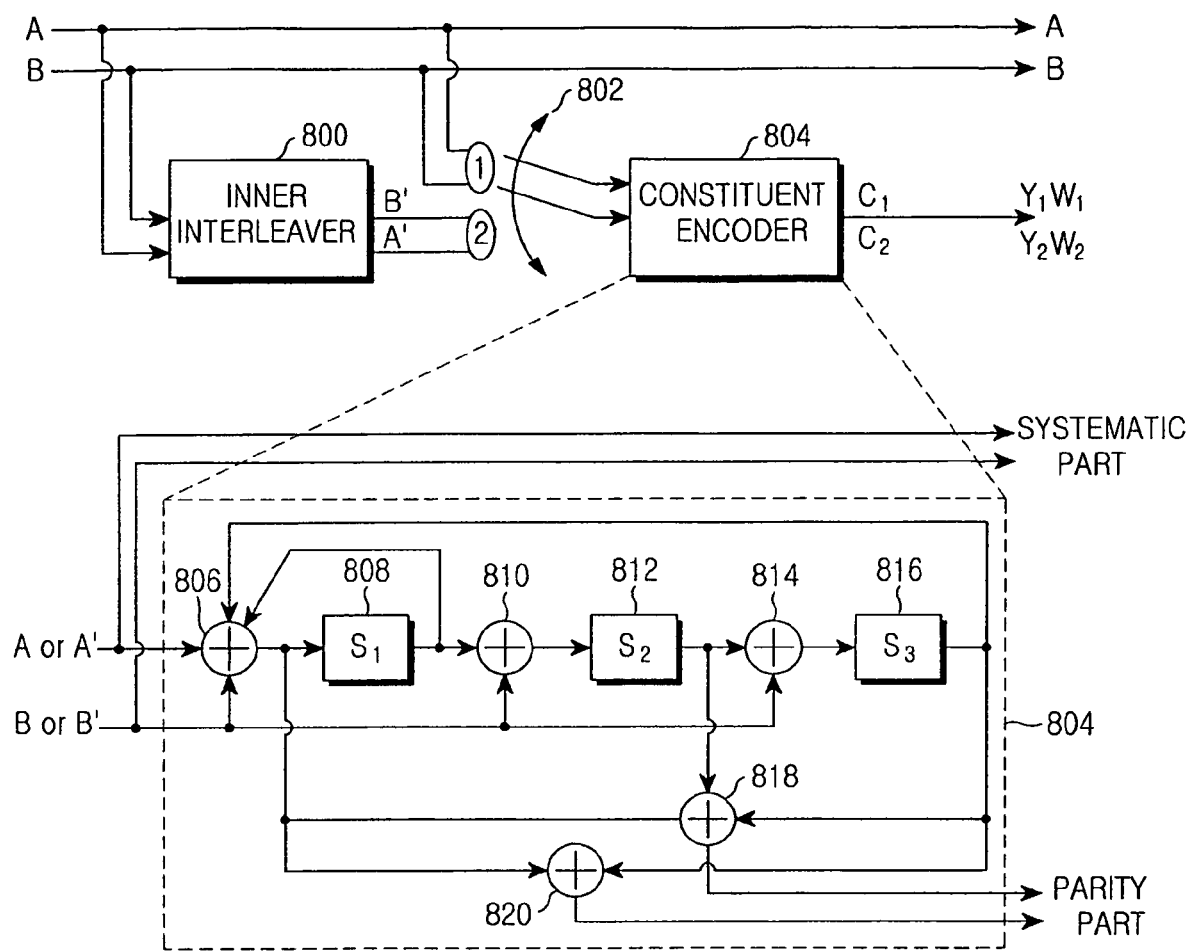
FIG. 8 illustrates a structure of a turbo encoder applied to a WiBro system according to an exemplary embodiment of the present invention.

FIG. 8 illustrates a structure of a turbo encoder applied to a WiBro system according to an exemplary embodiment of the present invention. For convenience, a constituent encoder having a simplified memory structure is shown herein.

Referring to FIG. 8, bits of an information block to be encoded are alternately input as A and B. That is, the Most Significant Bit (MSB) of the information block is input as A, and the next MSB is input as B. Accordingly, the information block is divided into input bit streams A and B.

To support the circular states, the turbo encoder outputs the intact input bit streams A and B as systematic bit streams. An inner interleaver 800 interleaves the input bit streams A and B, and outputs the interleaved bit streams A' and B'.

A switch 802 selects the input bit streams A and B, and inputs the selected bit streams A and B to a constituent encoder 804. Initial memory states, that is, registers 808, 812 and 816, of the constituent encoder 804 are all initialized to '0'. In the constituent encoder 804, bits of the input bit streams A are sequentially input to a first adder 806, and bits of the input bit stream B are simultaneously input to first to third adders 806, 810 and 814. The first adder 806 adds up the bits of the bit streams A and B and the output bit of the last register 816, and outputs the result to a first register 808. The second adder 810 adds the output bit of the first register 808 and the bit of the bit stream B, and outputs the result to a second register 812. The third adder 814 adds the output bit of the second register 812 and the bit of the bit stream B, and outputs the result to a third register 816. A third adder 818, every time it receives a bit, adds up the output bit of the first adder 806, the output bit of the second register 812, and the output bit of the third register 816, and outputs the result. A fifth adder 820 adds up the output bit of the first adder 806 and the output bit of the third register 816, and outputs the result. Each of the first and second adders 806 and 810 adds up its inputs, performs a modulo-2 operation thereon, and outputs a 1-bit result.

The first encoded bit streams of the constituent encoder 804, associated with the input bit streams A and B, are state values for initializing again the memory states of the registers 808, 812 and 816. Specifically, the turbo encoder includes a circular state table for mapping state values for the first encoded bit streams of the constituent encoder 804 to circular memory states associated with the state values. For example, after the first encoded bit streams are output, state values S for the last values $S_1$, $S_2$, and $S_3$ of the third registers 808, 812, and 816 are calculated as $S=4S_1+2S_2+S_3$.

Once the circular memory states of the constituent encoder 804 are determined according to the state values determined depending on the first encoded bit streams and to a size N of the information block, the registers 808, 812 and 816 are reinitialized according to the circular memory states. Thereafter, through the same operation, second encoded bit streams are generated from the constituent encoder 804. The second encoded bit streams for the input bit streams A and B become parity bit streams $Y_1$ and $W_1$.

Next, the switch 802 selects the interleaved bit streams A' and B', and inputs the selected bit streams A' and B' to the constituent encoder 804. The constituent encoder 804, as described above, initializes initial memory states to '0', encodes the interleaved bit streams A' and B' to calculate circular memory states, initializes the registers 808, 812 and 816 according to the circular memory states, and then re-encodes the interleaved bit streams A' and B', thereby obtaining parity bit streams $Y_2$ and $W_2$. In other words, to obtain one parity bit pair (Y, W), the operation of the constituent encoder 804 is performed two times, and the parity bit streams can be obtained in a second operation.

FIG. 9 illustrates exemplary circular memory states for a turbo code with a constraint length K=9 applied to a WiBro system according to an exemplary embodiment of the present invention.

As illustrated, the circular memory states are determined according to state values S associated with the first encoded bit streams and a value obtained by performing a modulo-7 operation for a size N of an information block (N mod 7). The circular memory states determined according to the N mod 7 operation value become one of [0, 6, 4, 2, 7, 1, 3, 5], [0, 3, 7, 4, 5, 6, 2, 1], [0, 5, 3, 6, 2, 7, 1, 4], [0, 4, 1, 5, 6, 2, 7, 3], [0, 2, 5, 7, 1, 3, 4, 6], and [0, 7, 6, 1, 3, 4, 5, 2].

With the use of the encoder's characteristic of equally matching the initial memory states to the final memory states, it is possible to obtain burst quality information for the entire concatenated burst in the process of decoding each fragment block. That is, the burst quality information of the concatenated burst is obtained from the circular state check results in a decoder, acquired in the decoding process for each fragment block. The decoding process is to find the most similar decoded bit stream to the information bit stream using input LLR values. The decoder determines the state having the highest reliability among all possible state values generated according state transition of the input LLR values, and determines each decoded bit according to the determined state. Every time each of the decoded bits is output, the state value is affected by a previously decoded bit.

In an error-free ideal environment, the state values given when the first decoded bits are output are equal to the state values given when the finally decoded bits are output. This situation is said that circular states are satisfied. Therefore, if internal states of the decoder satisfy the circular states, it is determined that a corresponding fragment block was successfully decoded. On the contrary, if the internal states of the decoder do not satisfy the circular states, it is determined that the corresponding fragment block failed in decoding. However, even though the corresponding fragment block failed in decoding, the internal states of the decoder can satisfy the circular states by chance. Although the circular state check result cannot become an accurate decoding result as stated above, it is at least possible to regard all the cases not satisfying the circular states as decoding failed cases. Therefore, an exemplary embodiment of the present invention uses the circular state check result as a criterion for detecting a failure in decoding each fragment block.

As described above, in the WiBro system, a CRC for the entire burst is applied only to the burst supporting HARQ. According to an exemplary embodiment of the present invention, for a general concatenated burst not including a burst CRC, burst quality information is calculated for the entire concatenated burst every time decoding of each fragment block is completed, and whether to continuously decode the remaining fragment blocks is determined according to the burst quality information.

Figure 10:
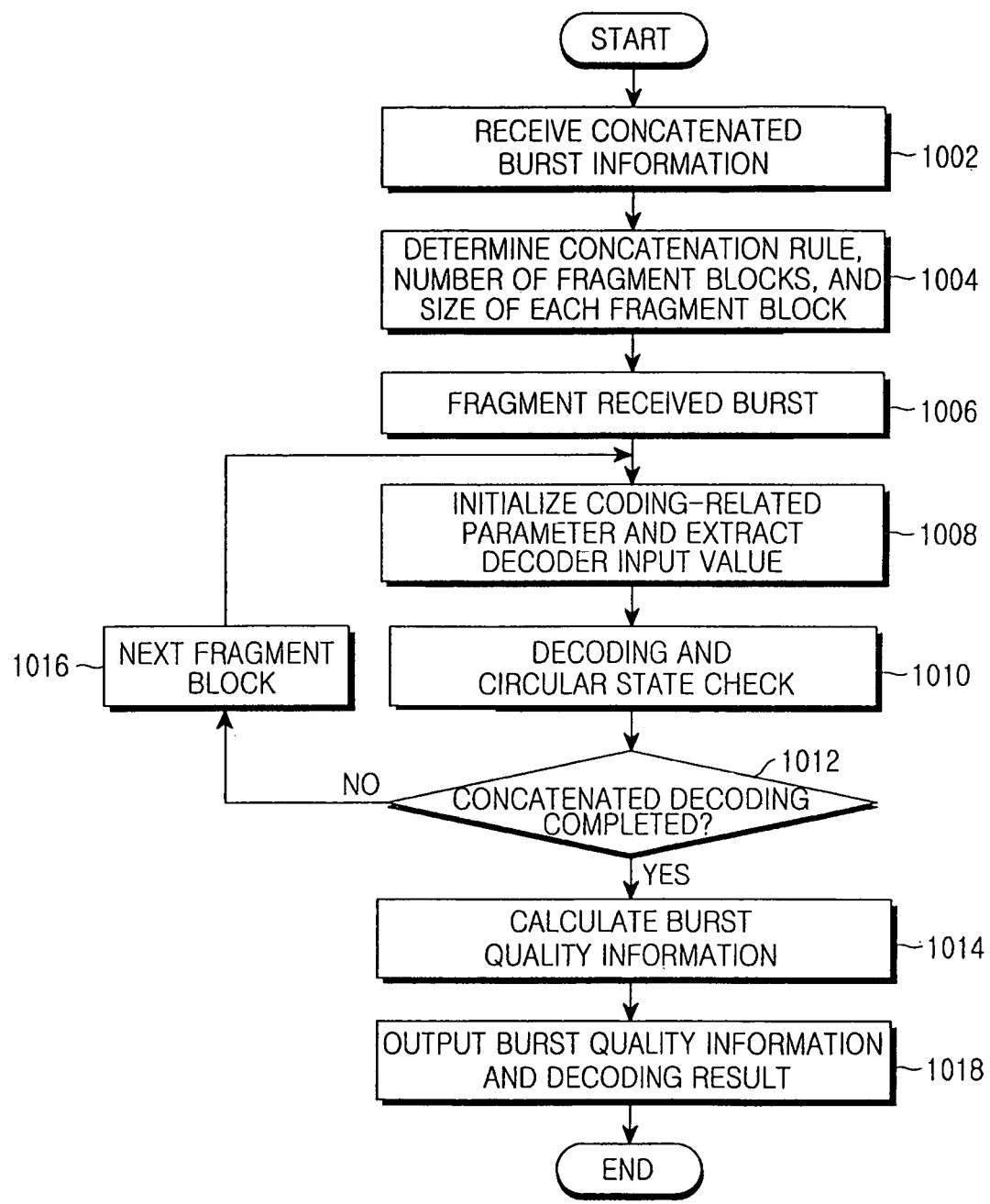
FIG. 10 is a flowchart illustrating a concatenated decoding operation according to an exemplary embodiment of the present invention.

FIG. 10 is a flowchart illustrating a concatenated decoding operation according to an exemplary embodiment of the present invention. Herein, the concatenated burst can be a general burst not including a CRC for the entire concatenated burst or a HARQ burst including the CRC.

Referring to FIG. 10, a concatenated decoding controller receives concatenated burst information in step 1002, and determines a concatenation rule, the number of fragment blocks, and a size of each fragment block according to the concatenated burst information in step 1004. The concatenated burst information can be previously determined, or acquired from control information transmitted from a transmitter to a receiver. In step 1006, a concatenated decoder fragments a received burst into fragment blocks according to the determined size and number of fragment blocks, and then proceeds to step 1008 to decode a first fragment block.

In step 1008, the concatenated decoder initializes memory states and coding-related parameters according to a coding scheme and a coding rate of a fragment block to be decoded. In step 1010, the concatenated decoder decodes the fragment block according to the corresponding coding scheme and coding rate, checks circular states of the fragment block, and outputs the circular state check result.

Figure 11:
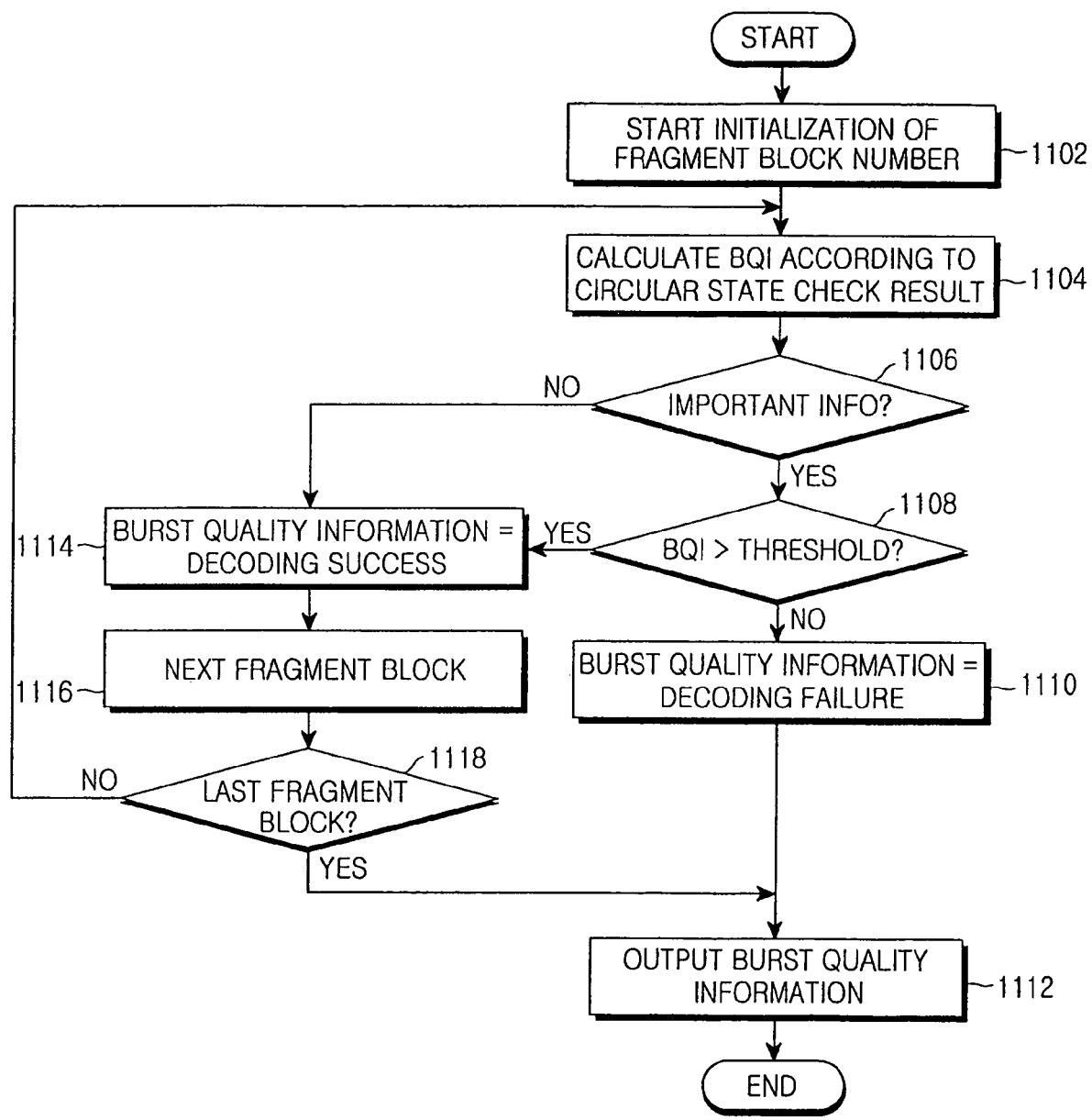
FIG. 11 is a flowchart illustrating an operation of classifying burst types and controlling decoding of a concatenated burst according to an exemplary embodiment of the present invention.

In step 1012, the concatenated decoder determines whether to complete the concatenated decoding on the received burst according to the circular state check result for the decoded block. A detailed operation of step 1012 is shown in FIG. 11, and a detailed description thereof will be made below. If the concatenated decoder determines not to complete the concatenated decoding, the concatenated decoder reads the next fragment block of the received burst in step 1016, and then returns to step 1008. On the contrary, if there is a need to stop the concatenated decoding, the concatenated decoder proceeds to step 1014 where it assembles the decoded fragment blocks in sequence to generate a concatenated burst, and determines the final burst quality information for the concatenated burst. Herein, the burst quality information is determined according to the circular state check result on each of the decoded fragment blocks. If the concatenated burst is an HARQ burst including a CRC, the burst quality information can further include the CRC check result. In step 1018, the concatenated decoding controller outputs the burst quality information. The burst quality information is delivered to an upper layer along with the decoded concatenated burst output from the concatenated decoder. Herein, the "upper layer" refers to a processing unit for parsing and processing the decoded concatenated burst.

As described above, the concatenated decoder obtains the circular state check result on each fragment block through circular state check in the process of decoding each fragment block. The obtained circular state check result on each fragment block is delivered to the concatenated decoding controller. The concatenated decoding controller calculates a Burst Quality Indication (BQI) value for the entire concatenated burst, every time decoding is completed for each fragment block depending and on the circular state check result on each fragment block and also the concatenation rule, the number of fragment blocks, and the size of each fragment block.

For example, based on the calculated BQI value of the concatenated burst, the concatenated decoding controller performs a decoding process for the next fragment block, or completes the decoding process for the concatenated burst. After completion of the decoding process, the concatenated decoding controller delivers the burst quality information including the BQI value to the upper layer. If the concatenated decoding process has been performed on the last fragment block, the concatenated decoding controller delivers the burst quality information including the BQI value calculated for the last decoded concatenated burst, to the upper layer.

A type of the burst applied to the WiBro system is roughly classified into a control burst and a data burst. The control burst is a FCH burst or a MAP burst composed of important information such as a frame format, a coding method of a transmission data burst, and subcarrier mapping information. The data burst is composed of use data. Therefore, in the decoding process, it is preferable to apply different controls according to burst type. For example, for the control burst, there is a need for accurate measurement of the burst quality because the decoding failure greatly affects the entire frame decoding. Further, it is determined whether to stop or continue the decoding process according to burst quality.

FIG. 11 is a flowchart illustrating an operation of classifying burst types and controlling decoding of a concatenated burst according to an exemplary embodiment of the present invention.

Referring to FIG. 11, in step 1102, the concatenated decoding controller performs initialization necessary for decoding of the concatenated burst so that the concatenated decoder performs decoding on the first fragment block of the concatenated burst. The concatenated decoder, after decoding the fragment block, checks circular states for the decoded fragment block, and delivers the circular state check result to the concatenated decoding controller. In step 1104, the concatenated decoding controller calculates a BQI value for the entire concatenated burst depending on the circular state check result. For example, the BQI value, a ratio of the number Bad_Blocks of fragment blocks having no circular state to the total number Total_Blocks of fragment blocks of the concatenated burst, is calculated by $$BQI = 1 - \frac{Bad\_Blocks}{Total\_Blocks} \qquad (1)$$

Therefore, an increase in the number of the fragment blocks having no circular state decreases the BQI value, and an increase in the number of fragment blocks satisfying the circular states increases the BQI value. Herein, the number Bad_Blocks of fragment blocks having no circular state is the number of fragment blocks having no circular state among the fragment blocks decoded up to now.

In step 1106, the concatenated decoding controller determines whether the concatenated burst is high-priority information. For example, the concatenated decoding controller determines whether the concatenated burst is a control burst, or a data burst having a high priority. Type information of the concatenated burst can be obtained from the upper layer. Some control bursts can be regarded as data bursts until the concatenated decoding process is completed, and can be considered as control bursts when the upper layer performs a burst parsing operation. Therefore, priority (importance) of each concatenated burst can be determined within a specific range by the upper layer in the concatenated decoding process.

If the concatenated burst is not a high-priority burst, the concatenated decoding controller proceeds to step 1114. On the contrary, if the concatenated burst is a high-priority burst, the concatenated decoding controller proceeds to step 1108 where it determines whether the BQI value is higher than a predetermined threshold. The threshold can be determined according to intension of the designer or the concatenated burst information. For example, in the case where the proportion of the fragment blocks having no circular states exceeds 50% of the entire concatenated burst, if the concatenated decoding controller intends to complete the concatenated decoding, the threshold is 0.5. If the BQI value is higher than the threshold, the concatenated decoding controller proceeds to step 1114. Otherwise, the concatenated decoding controller proceeds to step 1110 where it sets the burst quality information as 'decoding failure', and then proceeds to step 1112. The burst quality information can further include the circular state check result on each fragment block and the BQI value according to whether the upper layer needs them.

In step 1114, the concatenated decoding controller sets the burst quality information as 'decoding success', and then proceeds to step 1116. Similarly, the burst quality information can further include the circular state check result on each fragment block and the BQI value according to whether the upper layer needs them. The concatenated decoding controller receives the next fragment block in step 1116, and determines in step 1118 whether the next fragment block is the last fragment block. If the next fragment block is not the last fragment block, the concatenated decoding controller returns to step 1104. However, if the next fragment block is the last fragment block, the concatenated decoding controller proceeds to step 1112. In step 1112, the concatenated decoding controller completes the concatenated decoding, and outputs the burst quality information. The decoded entire concatenated burst including the last fragment block is output from the concatenated decoder, and delivered to the upper layer together with the burst quality information.

In the concatenated decoder, the circular state check on each fragment block is performed by comparing a state value for the first decoded bit of the fragment block with a state value for the last decoded bit. That is, as described above, due to the encoder's characteristic of equally matching the initial memory states to the final memory states, it is necessary to match the state values of the decoder. If the state values are not matched, this is regarded as the failure in decoding. The concatenated decoder, if the state values are matched, determines that there is high possibility that it has succeed in decoding.

Figure 12:
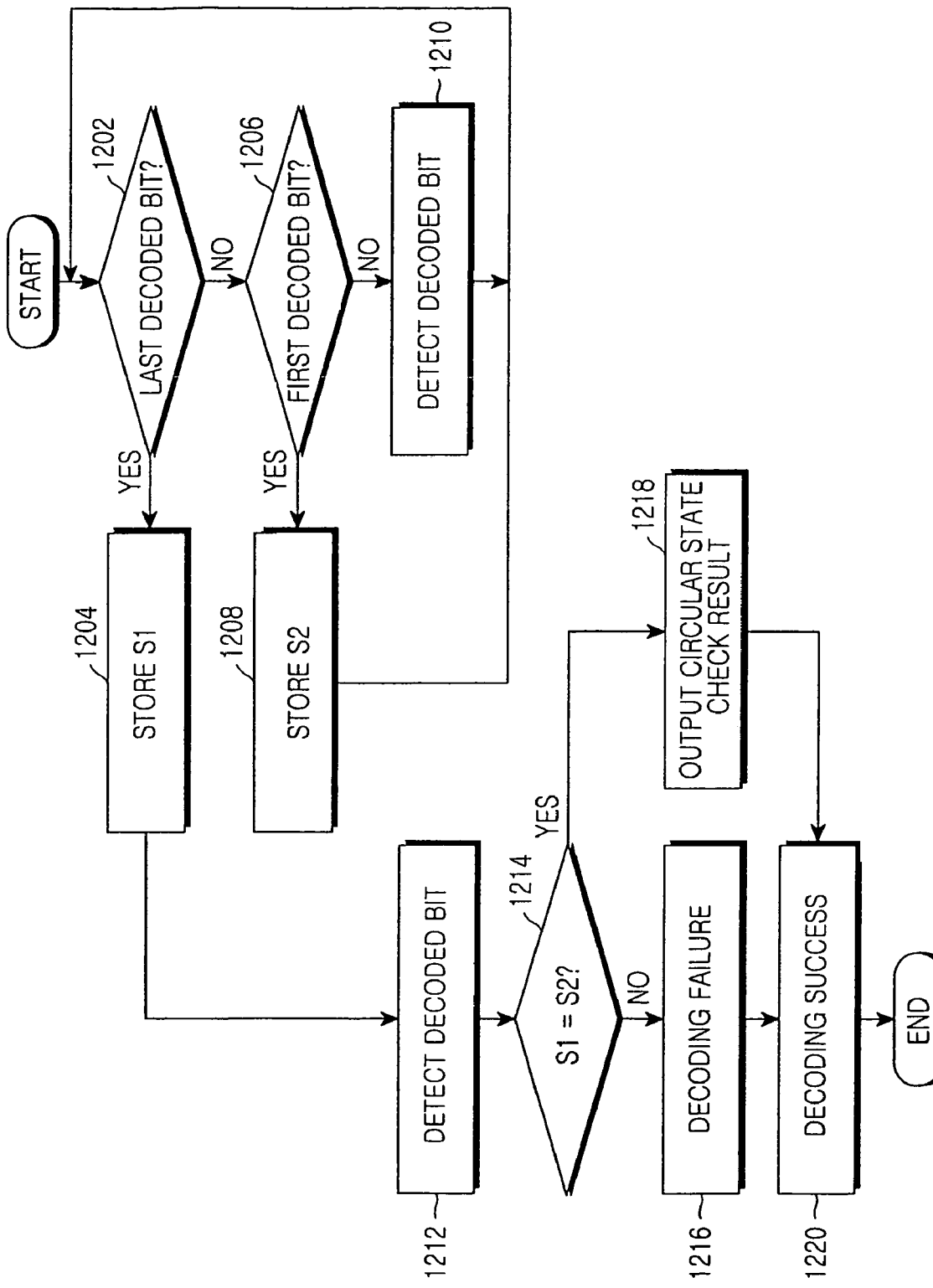
FIG. 12 illustrates a circular state check operation according to an exemplary embodiment of the present invention.
Figure 13:
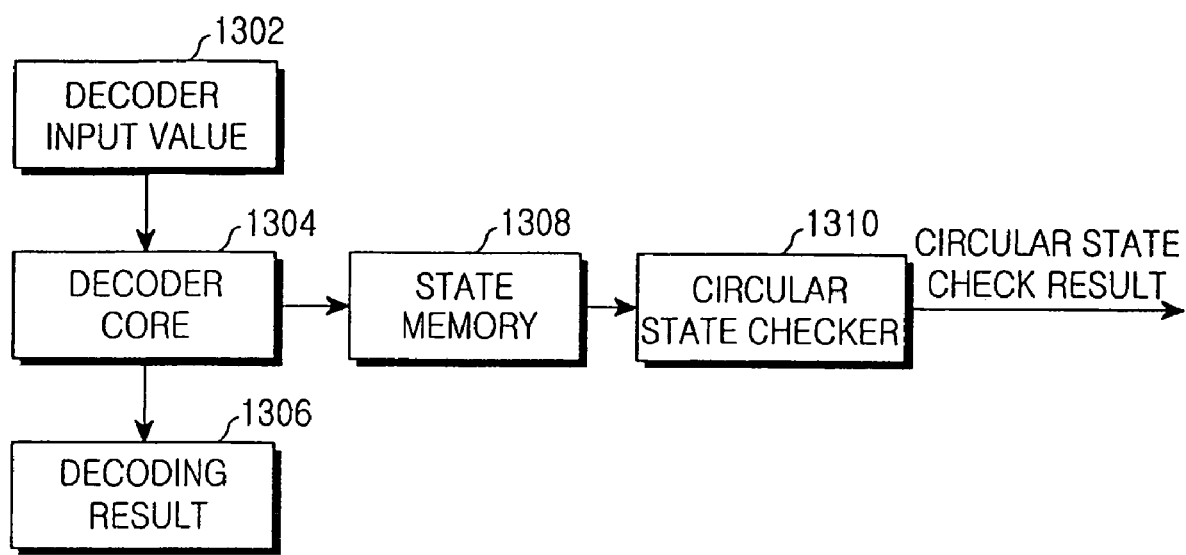
FIG. 13 illustrates a structure of a concatenated decoder capable of checking circular states according to an exemplary embodiment of the present invention.

FIG. 12 illustrates a circular state check operation according to an exemplary embodiment of the present invention, and FIG. 13 illustrates a structure of a concatenated decoder capable of checking circular states according to an exemplary embodiment of the present invention.

Referring to FIGS. 12 and 13, in step 1202, a decoder core 1304 starts decoding depending on input LLR values 1302, and determines whether the detected bit is the last decoded bit. Herein, the detection order of the decoded bits can be subject to change according to decoding algorithm. Therefore, it should be noted herein that the "last decoded bit" means an order of a decoded bit rather than an input order of a corresponding information bit. That is, in the encoding process, the last decoded bit corresponds to a start bit of an input bit stream, and in the decoding process, the last decoded bit corresponds to the last bit. If the detected bit is not the last decoded bit, the decoder core 1304 proceeds to step 1206.

In step 1206, the decoder core 1304 determines whether the detected bit is the first decoded (start) bit. If the detected bit is the first decoded bit, a state value of the decoder core 1304 is stored as S2 in a state memory 1308 in step 1208. If the state value S2 for the first decoded bit is stored in step 1208, or if it is determined in step 1206 that the detected bit is not the first decoded bit, the decoder core 1304 proceeds to step 1210 where it detects the corresponding decoded bit.

However, if it is determined in step 1202 that the detected bit is the last decoded bit, the decoder core 1304 proceeds to step 1204 where it stores the state value of the last decoded bit in the state memory 1308 as S1. In step 1212, the decoder core 1304 detects the last decoded bit and outputs all the decoded bits as a decoding result 1306.

A circular state checker 1310 compares the decoding result 1306 including the last decoded bit, obtained according to the above process, that is, compares the two state values S1 and S2 stored in the state memory 1308.

If S1 is equal to S2 in step 1214, the circular state checker 1310 considers in step 1218 that the current fragment block has been successfully decoded. However, if S1 is different from S2, the circular state checker 1310 considers in step 1216 that it failed in decoding the current fragment block. In step 1220, the circular state checker 1310 provides the circular state check result indicating decoding success or decoding failure of the current fragment block to a concatenated decoding controller. For a turbo decoder, as it performs an iterative decoding process, the circular state checker 1310 outputs the circular state check result in the last iterative decoding process.

An operation of the concatenated decoding controller is divided into the following four operations according to the concatenated burst information, the BQI, and the threshold.

(1) An FCH Burst

As described above, the FCH burst, an independent single burst to which the concatenation rule is not applied, undergoes the same coding and decoding processes as the general concatenated burst except that randomization is not applied thereto. In addition, the FCH burst undergoes coding and decoding using convolutional decoding. Therefore, for the FCH burst, the concatenated decoding controller directly delivers a LLR value obtained through symbol demapping to the concatenated decoder without applying the concatenated rule. The concatenated decoding controller determines whether the circular state check result obtained from the concatenated decoder satisfies the circular states, and if the circular state check result does not satisfy the circular states, the concatenated decoding controller immediately stops decoding on the next burst. This is because the FCH burst contains the information that is located at the head of a frame and is necessary for parsing the frame. Therefore, if the FCH burst does not satisfy the decoder's circular states, the concatenated decoding controller stops decoding on the next bursts of the frame. On the contrary, if the FCH burst satisfies the decoder's circular states, the concatenated decoding controller performs decoding on the next bursts of the frame.

(2) A concatenated Burst in Which Burst Quality Decision Information Such as a CRC is Previously Inserted, Among the High-Priority Bursts The concatenated decoding controller regards the value of Equation (1) obtained in the decoding process of the concatenated burst as a BQI value of the concatenated burst, and updates the BQI value every fragment block decoding. The concatenated decoding controller compares the updated BQI value with a predetermined threshold. If the BQI value is less than or equal to the threshold, the concatenated decoding controller completes the concatenated decoding process in the current fragment block, and transmits the BQI value to the upper layer. However, if the BQI value is greater than the threshold, the concatenated decoding controller continues to perform the concatenated decoding process on the next fragment block. After performing the concatenated decoding process on the last fragment block, the concatenated decoding controller transmits the check result on a CRC included in the tail of the concatenated burst and the BQI value to the upper layer together with the burst quality information, completing the concatenated decoding process.

(3) A Concatenated Burst in Which the Burst Quality Decision Information is Not Inserted, Among the High-Priority Bursts In this case, similarly to case (2), the concatenated decoding controller regards the value of Equation (1) obtained in the decoding process of the concatenated burst as a BQI value of the concatenated burst, and updates the BQI value every fragment block decoding. If the updated BQI value is less than or equal to the threshold, the concatenated decoding controller completes the concatenated decoding process in the current fragment block, and transmits the BQI value to the upper layer. However, if the BQI value is greater than the threshold, the concatenated decoding controller continues to perform the concatenated decoding process on the next fragment block. After performing the concatenated decoding process on the last fragment block, the concatenated decoding controller transmits only the BQI value to the upper layer together with the burst quality information.

(4) A Low-Priority Burst

In this case, after completion of decoding every fragment block, the concatenated decoding controller calculates the BQI value of Equation (1). After performing the concatenated decoding process on up to the last fragment block without interruption, the concatenated decoding controller transmits the calculated BQI value to the upper layer.

As can be understood from the foregoing description, the decoder according to the present invention checks circular states using the characteristic of the codeword applied to the WiBro system, thereby obtaining burst quality information for the entire burst and a BQI value of each fragment block. In addition, based on the obtained BQI value of each fragment block and the concatenated burst information, the decoder applies a differential decoding algorithm for each individual burst, facilitating efficient concatenated decoding. In this way, the present invention can obtain burst quality information not only for the HARQ burst but also for all other concatenated bursts, and compulsorily stops the concatenated decoding process for the bad bursts, thereby preventing unnecessary decoding process for the low-quality bursts. The prevention of the unnecessary decoding process contributes to a reduction in power consumption for decoding in the WiBro system. In addition, the upper layer can rapidly acquire the burst quality information for the low-quality bursts and also for all other bursts, facilitating efficient upper layer processing for each concatenated burst.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for decoding a concatenated burst in a WiBro system, the method comprising:
fragmenting a received burst into fragment blocks;
decoding at least one of the fragment blocks, and determining whether the decoded fragment block satisfies a circular state;
determining burst quality information of the received burst according to a circular state check result on the decoded fragment block; and
determining whether to stop decoding on the received burst according to the burst quality information.

2. The method of claim 1, wherein the determining of whether the decoded fragment block satisfies a circular state comprises determining that the decoded fragment block satisfies the circular state, if a first state value determined while obtaining a first decoded bit of the decoded fragment block is equal to a second state determined while obtaining a last decoded bit.

3. The method of claim 1, further comprising determining whether the received burst includes information having a priority, and determining the burst quality information if the received burst includes the information having the priority.

4. The method of claim 3, further comprising the step of determining the burst quality information if the received burst comprises at least one of a control burst and a data burst having a high priority.

5. The method of claim 1, further comprising determining a ratio of a number of fragment blocks not comprising a circular state to a total number of fragment blocks of the received burst, as the burst quality information.

6. The method of claim 5, further comprising determining whether to stop decoding on the received burst, if the ratio does not exceed a threshold.

7. The method of claim 6, further comprising decoding a next fragment block of the received burst, if the ratio exceeds the threshold.

8. The method of claim 1, further comprising outputting the burst quality information to an upper layer after stopping the decoding on the received burst.

9. The method of claim 1, further comprising outputting frame quality information to an upper layer, if the decoded fragment block is a last block of the received burst.

10. The method of claim 9, further comprising delivering information indicating presence and absence of an error in the received burst based on the burst quality information to the upper layer along with the burst quality information, if the decoded fragment block is a last block of the received burst and the received burst includes the burst quality decision information inserted by a transmitter.

11. The method of claim 1, wherein the fragment blocks comprises at least one of a fundamental channel (FCH) burst, a Hybrid Automatic Repeat reQuest (HARQ) burst, a mapping (MAP) burst, and a general data burst.

12. An apparatus for decoding a concatenated burst in a WiBro system, the apparatus comprising:
a concatenated decoder for fragmenting a received burst into fragment blocks, decoding at least one of the fragment blocks, and determining whether the decoded fragment block satisfies a circular state; and
a concatenated decoding controller for determining burst quality information of the received burst according to a circular state check result on the decoded fragment block, and determining whether to stop decoding on the received burst according to the burst quality information.

13. The apparatus of claim 12, wherein the concatenated decoder comprises:
a decoder core for decoding the decoded fragment block, and outputting a plurality of decoded bits;
a state memory for storing a first state value determined while obtaining a first decoded bit of the decoded fragment block and a second state value determined while obtaining a last decoded bit; and
a circular state checker for determining that the decoded fragment block satisfies a circular state, if the first state value is equal to the second state value.

14. The apparatus of claim 12, wherein the circular state checker determines whether the received burst includes information having a priority, and if the received burst includes information having the priority, the circular state checker determines whether the decoded fragment block satisfies a circular state.

15. The apparatus of claim 12, wherein the concatenated decoding controller determines the burst quality information if the received burst comprises at least one of a control burst and a data burst having a high priority.

16. The apparatus of claim 12, wherein the concatenated decoding controller determines a ratio of a number of fragment blocks not comprising a circular state to a total number of fragment blocks of the received burst, as the burst quality information.

17. The apparatus of claim 16, wherein the concatenated decoding controller determines whether to stop decoding on the received burst, if the ratio does not exceed a threshold.

18. The apparatus of claim 17, wherein the concatenated decoding controller controls the concatenated decoder to decode a next fragment block of the received burst, if the ratio exceeds the threshold.

19. The apparatus of claim 12, wherein the concatenated decoding controller outputs the burst quality information to an upper layer after stopping the decoding on the received burst.

20. The apparatus of claim 12, wherein the concatenated decoding controller outputs the frame quality information to an upper layer, if the decoded fragment block is a last block of the received burst.

21. The apparatus of claim 20, wherein the concatenated decoding controller delivers information indicating presence and absence of an error in the received burst based on the burst quality information to the upper layer along with the burst quality information, if the decoded fragment block is a last block of the received burst and the received burst includes the burst quality decision information inserted by a transmitter.

22. The apparatus of claim 12, wherein the fragment blocks comprises at least one of a fundamental channel (FCH) burst, a Hybrid Automatic Repeat reQuest (HARQ) burst, a mapping (MAP) burst, and a general data burst.

23. A method for decoding a frame composed of a plurality of bursts in a WiBro system, the method comprising:
decoding a fundamental channel (FCH) burst indicating a format of the frame, arranged at a head of the frame, and determining whether the decoded burst satisfies a circular state;
determining frame quality information of the FCH burst according to a circular state check result on the decoded burst; and
determining whether to stop decoding on bursts following the frame according to the frame quality information.

24. The method of claim 23, wherein the determining of whether the decoded burst satisfies a circular state comprises determining that the decoded burst satisfies the circular state, if a first state value determined while obtaining a first decoded bit of the decoded burst is equal to a second state determined while obtaining a last decoded bit.

25. The method of claim 23, further comprising determining whether to stop decoding on the frame, if the decoded burst does not satisfy the circular state.

26. The method of claim 25, further comprising decoding a next burst of the frame, if the decoded burst satisfies the circular state.

27. The method of claim 23, further comprising outputting the frame quality information to an upper layer after stopping the decoding on the frame.

28. An apparatus for decoding a frame composed of a plurality of bursts in a WiBro system, the apparatus comprising:
a concatenated decoder for decoding a fundamental channel (FCH) burst indicating a format of the frame, arranged at a head of the frame, and determining whether the decoded burst satisfies a circular state; and
a concatenated decoding controller for determining frame quality information of the FCH burst according to a circular state check result on the decoded burst, and determining whether to stop decoding on bursts following the frame according to the frame quality information.

29. The apparatus of claim 28, wherein the concatenated decoder comprises:
a decoder core for decoding the FCH burst and outputting a plurality of decoded bits;
a state memory for storing a first state value determined while obtaining a first decoded bit of the decoded burst and a second, state value determined while obtaining a last decoded bit; and a circular state checker for determining that the decoded burst satisfies a circular state, if the first state value is equal to the second state value.

30. The apparatus of claim 28, wherein the concatenated decoding controller determines whether to stop decoding on the frame, if the decoded burst does not satisfy the circular state.

31. The apparatus of claim 30, wherein the concatenated decoding controller decodes a next burst of the frame, if the decoded burst satisfies the circular state.

32. The apparatus of claim 30, wherein the concatenated decoding controller outputs the frame quality information to an upper layer after stopping the decoding on the frame.

* * * * *